United States Patent
Cho (10) Patent No.: US 12,286,304 B2
(45) Date of Patent: Apr. 29, 2025

(54) METHOD OF CONTROLLING TRANSPORT VEHICLE IN PRODUCTION FACTORY, VEHICLE CONTROL DEVICE, AND ARTICLE TRANSPORT SYSTEM

(71) Applicant: SEMES CO., LTD., Cheonan-si (KR)

(72) Inventor: Jae Hyoung Cho, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 620 days.

(21) Appl. No.: 17/481,271

(22) Filed: Sep. 21, 2021

(65) Prior Publication Data

US 2022/0089375 A1    Mar. 24, 2022

(30) Foreign Application Priority Data

Sep. 22, 2020  (KR) .................. 10-2020-0121957

(51) Int. Cl.
| B65G 17/12 | (2006.01) |
| B61B 3/02 | (2006.01) |
| B65G 43/10 | (2006.01) |
| H01L 21/677 | (2006.01) |

(52) U.S. Cl.
CPC ............. *B65G 17/12* (2013.01); *B65G 43/10* (2013.01); *H01L 21/67724* (2013.01); *B61B 3/02* (2013.01)

(58) Field of Classification Search
CPC ...... B65G 17/12; B65G 43/10; B65G 1/0457; B65G 43/00; H01L 21/67724; H01L 21/67276; H01L 21/67727; H01L 21/67733; B61B 3/02; G05B 19/41895; G05B 2219/31002; G05D 1/0005; G05D 1/0212; H02J 3/003

USPC .......................................................... 701/19
See application file for complete search history.

(56) References Cited

U.S. PATENT DOCUMENTS

| 2020/0207250 A1 * | 7/2020 | Jarvis ................. G01C 21/3623 |
| 2021/0325862 A1 * | 10/2021 | Buerger ............... G05D 1/0297 |
| 2021/0380380 A1 * | 12/2021 | Gentile ................ G05D 1/0297 |
| 2021/0391201 A1 * | 12/2021 | Lin .................... H01L 21/67259 |
| 2022/0036310 A1 * | 2/2022 | Heinla ................... G06Q 10/08 |

FOREIGN PATENT DOCUMENTS

| JP | 09-282038 | 10/1997 |
| JP | 2010092321 | 4/2010 |
| JP | 2017068455 | 4/2017 |
| JP | 2020-075785 | 5/2020 |
| JP | 2020075785 A * | 5/2020 |
| KR | 10-2018-0076283 | 7/2018 |

OTHER PUBLICATIONS

Office Action from the China National Intellectual Property Administration dated Aug. 21, 2023.
Office Action from the Korean Intellectual Property Office dated Apr. 17, 2023.

* cited by examiner

*Primary Examiner* — Scott A Reinbold (57) ABSTRACT

A method of controlling a transport vehicle in an article transport system in a production factory includes checking tasks for transporting articles, searching for routes for the respective tasks for a plurality of transport vehicles, calculating expected power consumption for the respective tasks of the transport vehicles, and assigning the tasks to the transport vehicles based on the expected power consumption for the respective tasks and remaining power of the transport vehicles.

5 Claims, 10 Drawing Sheets

METHOD OF CONTROLLING TRANSPORT VEHICLE IN PRODUCTION FACTORY, VEHICLE CONTROL DEVICE, AND ARTICLE TRANSPORT SYSTEM

CROSS REFERENCE TO RELATED APPLICATION

The present application claims priority to Korean Patent Application No. 10-2020-0121957, filed Sep. 22, 2020, the entire contents of which is incorporated herein for all purposes by this reference.

BACKGROUND OF THE INVENTION

Field of the Invention

The present disclosure relates to a method of controlling a transport vehicle in a production factory, a vehicle control device, and an article transport system, and more particularly, to a method of assigning a task in consideration of power of a transport vehicle having a battery, a vehicle control device, and an article transport system.

Description of the Related Art

A process of manufacturing a semiconductor (or a display) refers to a process of manufacturing a semiconductor element on a substrate (e.g., a wafer) and includes exposure, deposition, etching, ion-doping, cleaning, packaging, and the like, for example. A production factory for manufacturing semiconductor elements includes clean rooms disposed in a single layer or multiple layers, and production facilities for performing semiconductor manufacturing processes are disposed in the layers.

To maximize the efficiency of the semiconductor manufacturing process, there have been introduced a method of improving the semiconductor manufacturing process as well as a technique for quickly and efficiently transporting articles (e.g., substrates) between the production facilities. Representatively, an overhead hoist transport (OHT) system for transporting the article along a route installed on a ceiling of the semiconductor production factory is applied. In general, the OHT system includes a rail which constitutes the movement route, and a transport vehicle which transports the article while moving along the rail. In addition, a storage system may be provided to store the articles when the articles need to be stored during the process of transporting the articles between the semiconductor production facility.

Meanwhile, the transport vehicle operates using electrical energy. The transport vehicle mainly receives power from a power supply device (a non-contact power supply system) mounted on a rail. In addition, the transport vehicle may have a battery that is charged with power at a predetermined position, and the transport vehicle may operate using power stored in the battery. There is a need for a method of efficiently assigning a task and a traveling route to a transport vehicle that operates by receiving power from the power supply device on the rail or receiving power stored in the battery.

SUMMARY OF THE INVENTION

The present disclosure has been made in an effort to provide a method of efficiently assigning a task in consideration of power of a vehicle having a battery, a vehicle control device, and an article transport system.

The object of the present disclosure is not limited to the above-mentioned object, and other objects, which are not mentioned above, may be clearly understood by those skilled in the art from the following descriptions.

An exemplary embodiment of the present disclosure provides a method of controlling a transport vehicle in an article transport system in a production factory, the method including: checking tasks for transporting articles; searching for routes for the respective tasks for a plurality of transport vehicles; calculating expected power consumption for the respective tasks of the transport vehicles; and assigning the tasks to the transport vehicles based on the expected power consumption for the respective tasks and remaining power of the transport vehicles.

In the embodiment, the calculating of the expected power consumption for the respective tasks may include: calculating movement distances of the transport vehicles for the respective tasks; deriving a distance of a power supply section and a distance of a non-power supply section from the movement distances of the transport vehicles for the respective tasks; and calculating expected power consumption for the respective tasks of the transport vehicles from the distance of the non-power supply section.

In the embodiment, the assigning of the tasks to the transport vehicles may include: calculating cost values of the transport vehicles for the respective tasks based on ratios between the expected power consumption for the respective tasks and the remaining power of the transport vehicles; and assigning the tasks to the transport vehicles based on the cost values of the transport vehicles for the respective tasks.

In the embodiment, the cost values may be assigned in accordance with a range in which values made by dividing the remaining power of the transport vehicles by the expected power consumption for the respective tasks are present.

In the embodiment, the cost value may be set to a maximum value when the value made by dividing the remaining power of each of the transport vehicles by the expected power consumption for each task is smaller than a reference value.

In the embodiment, the assigning of the tasks to the transport vehicles may include assigning a specific task to a transport vehicle having the smallest cost value based on the specific task.

In the embodiment, the assigning of the tasks to the transport vehicles may include assigning a task, which has the smallest cost value based on a specific transport vehicle, to the specific transport vehicle.

Another exemplary embodiment of the present disclosure provides a vehicle control device for controlling a transport vehicle in an article transport system in a production factory, the vehicle control device including: a communication part configured to receive task information from a manufacturing control device and transmit a control signal to the transport vehicle; a processor configured to perform a calculation for controlling the transport vehicle; and a memory configured to store information for controlling the transport vehicle. The processor may be configured to: check tasks for transporting articles; search for routes for the respective tasks for a plurality of transport vehicles; calculate expected power consumption for the respective tasks of the transport vehicles; and assign the tasks to the transport vehicles based on the expected power consumption for the respective tasks and remaining power of the transport vehicles Still another exemplary embodiment of the present disclosure provides an article transport system for a production factory, the article transport system including: a manufacturing control device configured to create task information for transporting articles in the production factory; a vehicle control device configured to receive the task information from the manufacturing control device and assign tasks to transport vehicles; and the transport vehicles configured to transport the articles in accordance with the tasks assigned by the vehicle control device. The vehicle control device may be configured to: check tasks for transporting the articles; search for routes for the respective tasks for the plurality of transport vehicles; calculate expected power consumption for the respective tasks of the transport vehicles; and assign the tasks to the transport vehicles based on the expected power consumption for the respective tasks and remaining power of the transport vehicles.

According to the embodiment of the present disclosure, it is possible to efficiently manage the power of the vehicle having the battery by assigning the task to the vehicle based on the remaining power of the vehicle and the expected power consumption for each task.

The effect of the present disclosure is not limited to the above-mentioned effect, and other effects, which are not mentioned above, may be clearly understood by those skilled in the art from the following descriptions.

DETAILED DESCRIPTION OF THE INVENTION

Hereinafter, embodiments of the present disclosure will be described in detail with reference to the accompanying drawings so that those with ordinary skill in the art to which the present disclosure pertains may easily carry out the embodiments. The present disclosure may be implemented in various different ways and is not limited to the embodiments described herein.

A part irrelevant to the description will be omitted to clearly describe the present disclosure, and the same or similar constituent elements will be designated by the same reference numerals throughout the specification.

In addition, the constituent elements having the same configurations in the several embodiments will be assigned with the same reference numerals and described only in the representative embodiment, and only the constituent elements, which are different from the constituent elements according to the representative embodiment, will be described in other embodiments.

Throughout the specification, when one constituent element is referred to as being "connected to (or coupled to)" another constituent element, one constituent element can be "directly connected to (coupled to)" the other constituent element, and one constituent element can also be "indirectly connected to (coupled to)" the other element with other elements interposed therebetween. In addition, unless explicitly described to the contrary, the word "comprise/include" and variations such as "comprises/includes" or "comprising/including" will be understood to imply the inclusion of stated elements, not the exclusion of any other elements.

Unless otherwise defined, all terms used herein, including technical or scientific terms, have the same meaning as commonly understood by those skilled in the art to which the present disclosure pertains. The terms such as those defined in a commonly used dictionary should be interpreted as having meanings consistent with meanings in the context of related technologies and should not be interpreted as ideal or excessively formal meanings unless explicitly defined in the present application.

Figure 1:
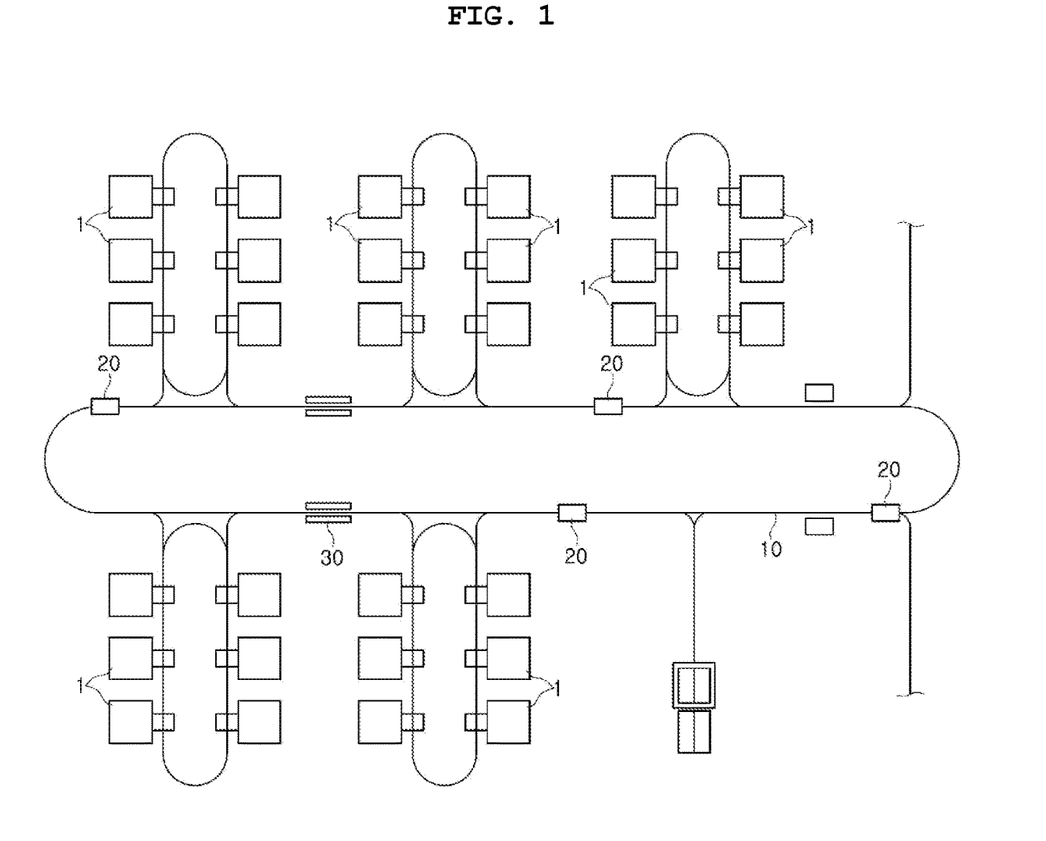
FIG. 1 is a view illustrating production facilities in a production factory and an example of a layout for transporting and storing articles.

FIG. 1 illustrates production facilities in a production factory and an example of a layout for transporting and storing articles. A semiconductor or display manufacturing factory includes one or more clean rooms, and a production facility 1 for performing a manufacturing process may be installed in each of the clean rooms. In general, a finally processed substrate (e.g., a wafer or a glass sheet) may be completely manufactured by performing a plurality of manufacturing processes on the substrate. When the manufacturing process is completed in the specific semiconductor production facility 1, the substrate is transported to a facility for performing a subsequent manufacturing process. In this case, the substrate may be transported in a state in which the substrate is stored in a container (e.g., a front opening unified pod (FOUP)) capable of accommodating a plurality of substrates. The container, which accommodates the substrates, may be transported by a transport vehicle (e.g., overhead hoist transport (OHT)) 20.

The transport vehicles 20 interface with a high-level server or a vehicle control device 150 in a wireless communication manner while moving along rails 10 installed on a ceiling, and the vehicle control device 150 provides an instruction in relation to a transport task. The vehicle control device 150 receives, from an integrated control system or a manufacturing control device 100, an instruction on the transport according to a working process. The vehicle control device 150 searches for the shortest route from a starting point to a destination under the instruction of the manufacturing control device 100 to allow the transport vehicle 20 to complete a transport task within the shortest time. The vehicle control device 150 selects the transport vehicle 20 positioned at an optimal position at which the transport vehicle 20 appropriately performs the transport task, and the vehicle control device 150 provides a transport instruction or a task to the transport vehicle 20. Based on the transport instruction of the vehicle control device, the transport vehicle 20 transports the article from a starting position to a destination position defined by the instruction of the vehicle control device.

Referring to FIG. 1, in the semiconductor or display manufacturing line, the production facilities 1 may be installed to perform the processes, the rails (e.g., ceiling rails) 10 may be provided to define the transport routes for transporting the articles between the production facilities 1, and the plurality of transport vehicles 20 may be provided to transport the articles to the production facilities 1 while moving along the rails 10. In this case, the article transport vehicle 20 may be supplied with drive power through a power supply unit (e.g., a power supply cable) disposed along the rail 10.

When the transport vehicle 20 transports the article between the production facilities 1, the article may be transported from a specific production facility directly to another production facility, or the article may be stored in a storage device and then transported to another production facility. A storage device (e.g., an article storage part 30) may be installed at one side of the rail 10. The storage device may include: a stocker provided in the form of a rack and configured to inject an inert gas into the container to maintain a clean environment in the container; and a lateral rail buffer installed adjacent to a lateral side of the rail 10 and configured to store the article, a lower rail buffer installed in a lower region of the rail 10 and configured to store the article, or a maintenance lifter used to maintain and repair the transport vehicle.

Figure 2:
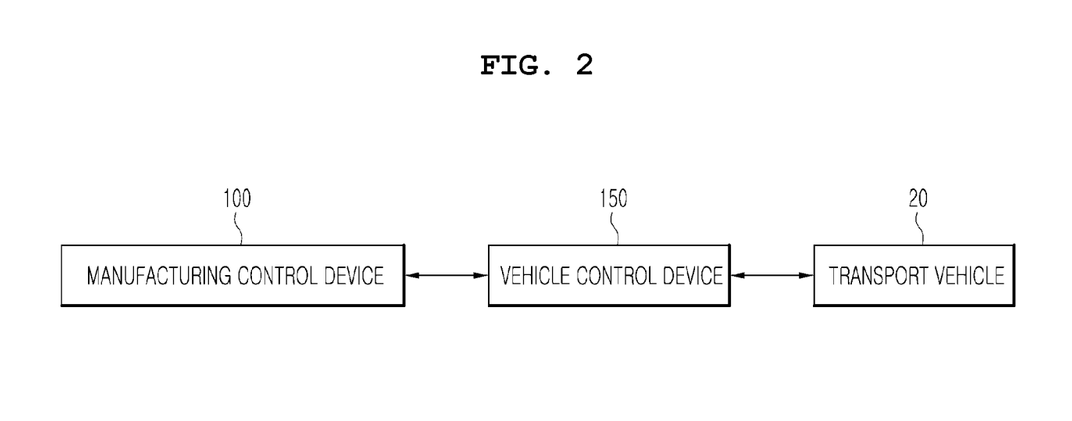
FIG. 2 is a view illustrating an example of an article transport system in the production factory according to the embodiment of the present disclosure.

FIG. 2 illustrates an example of an article transport system in the production factory according to the embodiment of the present disclosure. The article transport system for a production factory according to the embodiment of the present disclosure includes the manufacturing control device 100 configured to create task information for transporting the articles in the production factory, the vehicle control device configured to receive the task information from the manufacturing control device 100 and assign the tasks to the respective transport vehicles 20, and the transport vehicles 20 configured to transport the articles based on the tasks assigned by the vehicle control device 150.

The manufacturing control device 100 manages the entire manufacturing process performed in the production factory. For example, when a process is completed in a specific facility, the manufacturing control device 100 may determine a facility for performing a subsequent process and create a task for transporting the substrate from the facility, in which the corresponding process has been completed, to the next facility. The vehicle control device 150 creates a route for performing the article transport for each task received from the manufacturing control device 100, assigns the tasks to the respective vehicles 20, and instructs the vehicle 20 to transport the corresponding article.

The manufacturing control device 100, the vehicle control device 150, and the transport vehicle 20 may be connected to one another through a wired or wireless network. For example, the manufacturing control device 100 and the vehicle control device 150 may be connected through a local area network. The transport vehicle 20 may transmit or receive a signal to/from the vehicle control device 150 through wireless communication.

Figure 3:
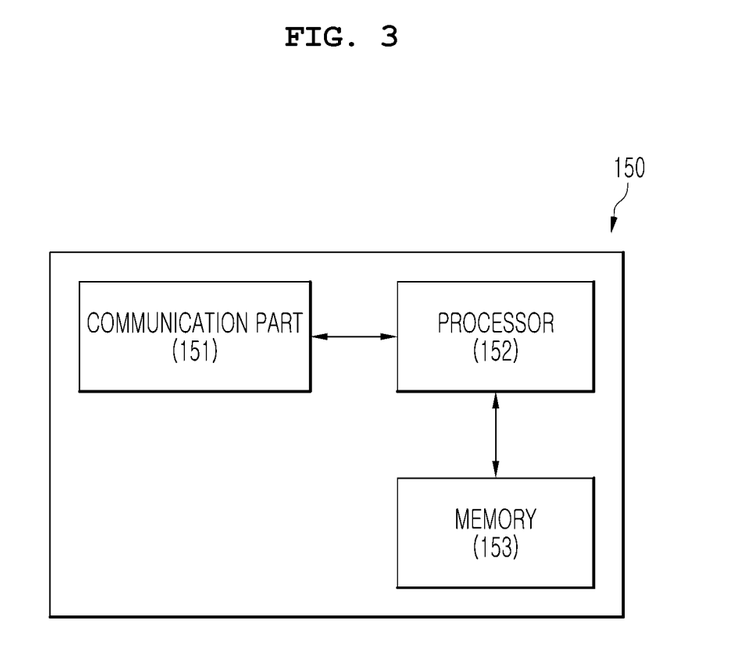
FIG. 3 is a block diagram illustrating a functional configuration of a vehicle control device according to the embodiment of the present disclosure.

FIG. 3 is a block diagram illustrating a functional configuration of the vehicle control device 150 according to the embodiment of the present disclosure. The vehicle control device 150 according to the embodiment of the present disclosure includes a communication part 151 configured to receive the task information from the manufacturing control device 100 and transmit the control signal to the transport vehicle 20, a processor 152 configured to perform a calculation for controlling the transport vehicle 20, and a memory 153 configured to store information for controlling the transport vehicle 20.

The communication part 151 processes, transmits, and receives signals for communication between the vehicle control device 150 and other elements. For example, the communication part 151 may receive task information (e.g., a transport article, a starting position, and an ending position) from the task control device 100 and transmit instructions (e.g., a starting point, an ending point, a route, and article information) for performing the corresponding task to the transport vehicle 20. To communicate with the transport vehicle 20, the communication part transmits a message to the transport vehicle 20 and transmits identification information on the transport vehicle 20 to the access point to which the transport vehicle 20 is connected in a wireless manner.

The processor 152 may perform the calculation and signal processing for controlling the respective transport vehicles 20. The processor 152 may include one or more processing circuits for performing the arithmetic operations and the signal processing. The processor 152 may monitor a state of the article transport system and set a movement route for the transport vehicle 20 to perform the task transmitted from the manufacturing control device 100.

The memory 153 may store data required to operate the vehicle control device 150. The memory 130 may store program data for operating the vehicle control device 150, information on the respective transport vehicles 20, and instructions for controlling the respective transport vehicles 20.

Figure 4A:
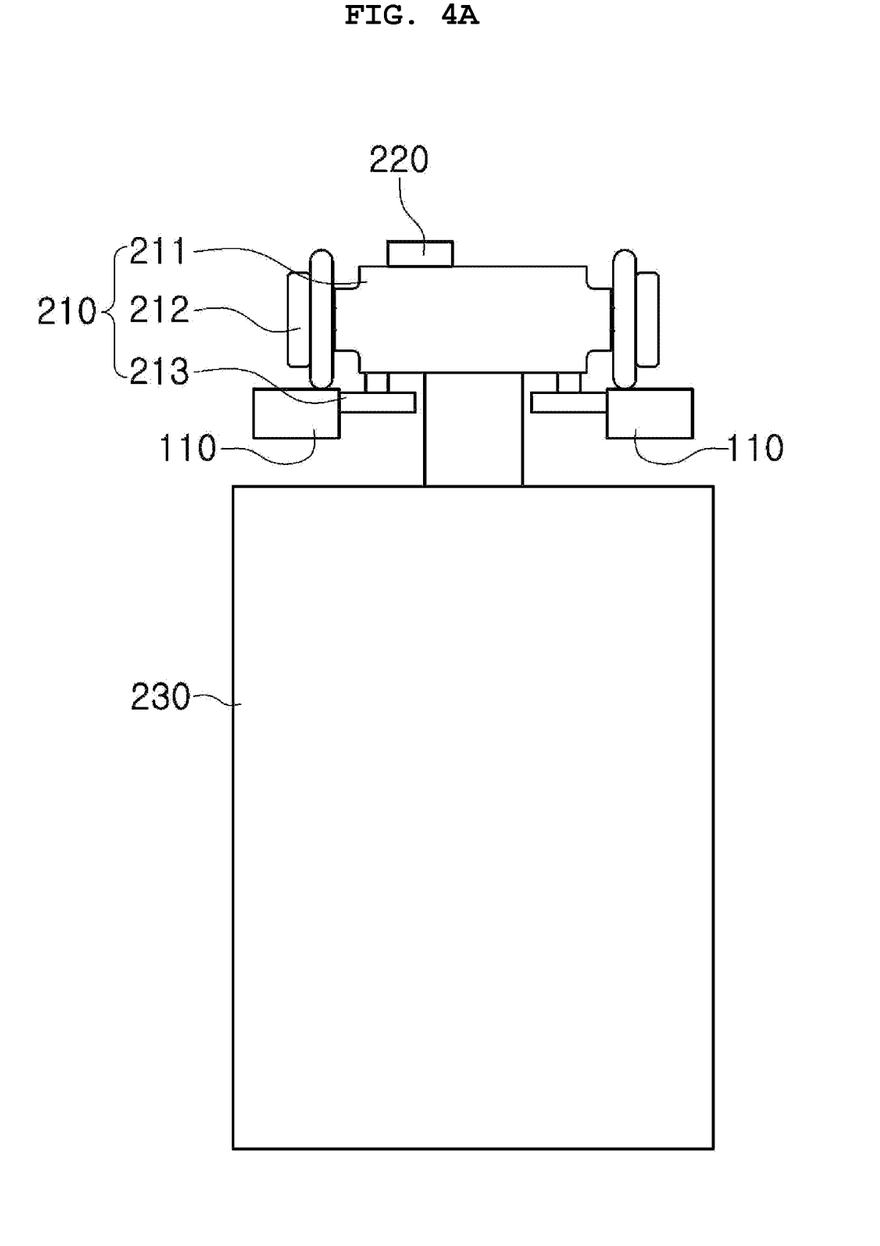
FIGS. 4A and 4B are views illustrating a schematic structure of a transport vehicle according to the embodiment of the present disclosure.
Figure 4B:
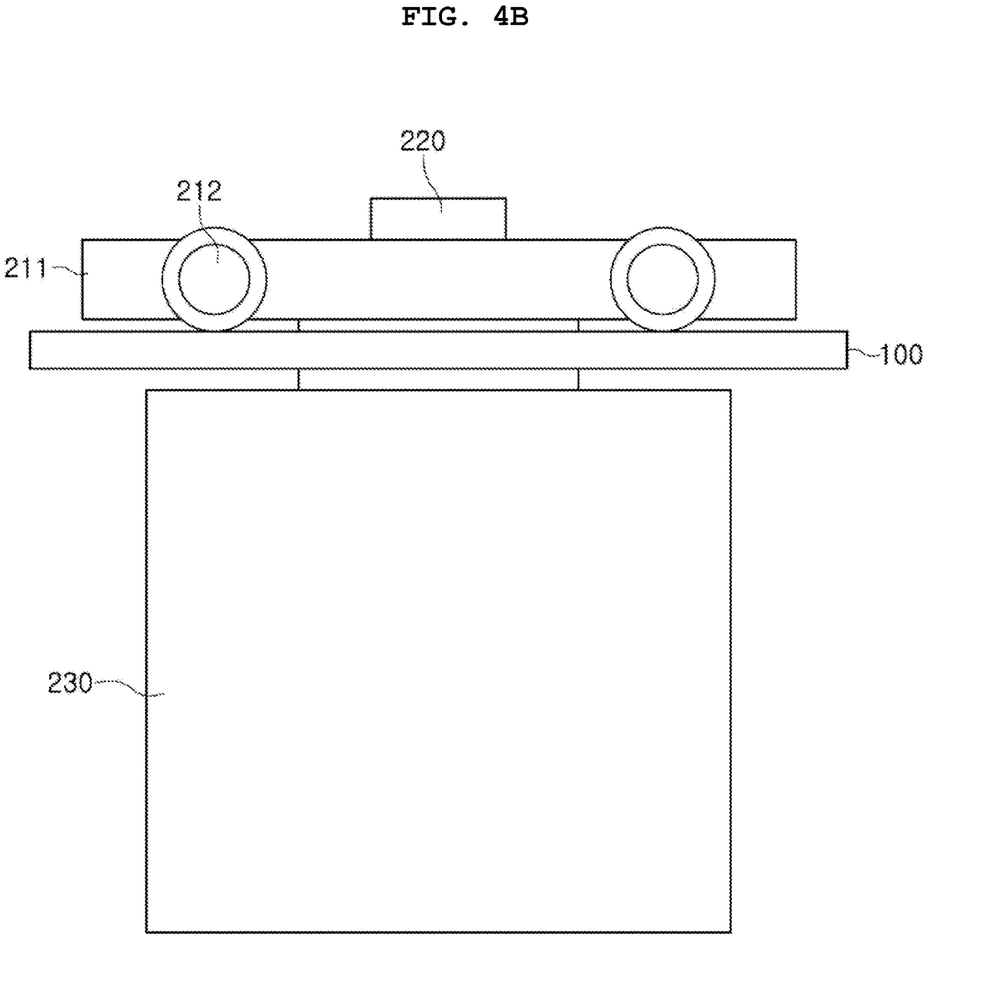

FIGS. 4A and 4B are views illustrating a schematic structure of the transport vehicle according to the embodiment of the present disclosure. FIG. 4A illustrates the transport vehicle 20 when viewed in a direction of a movement route, and FIG. 4B illustrates the transport vehicle 20 when viewed from the lateral side of the movement route.

Referring to FIGS. 4A and 4B, the transport vehicle 20 includes a traveling unit 210 configured to travel along traveling rails 110, a steering unit 220 configured to selectively come into contact with a steering guide rail at a branch part from which the traveling rails 110 branch off, a holding unit 230 configured to hold an article to be transported.

The traveling unit 210 includes a driving body 211 on which devices for driving the transport vehicle 20 are installed, traveling wheels 212 configured to rotate in a state of being in contact with the traveling rails 110, and traveling guide wheels 213 configured to rotate in a state of being in contact with lateral surfaces of the traveling rails 110. The transport vehicle 20 travels along the traveling rails 110 by the rotations of the traveling wheels 212. The traveling guide wheels 213 may prevent the transport vehicle 20 from separating from the traveling rails 110.

The steering unit 220 refers to a device that guides the transport vehicle 20 at the branch part to allow the transport vehicle 20 to selectively travel. A detailed configuration of the steering unit 220 according to the embodiment of the present disclosure will be described below in detail. The holding unit 230 may hold a transport target article and load or unload the article to/from the facility 1 while moving upward and downward.

According to the embodiment of the present disclosure, the transport vehicle 20 may operate by receiving power from a power supply device installed on the rail 10 or receiving power stored in a battery provided in the transport vehicle 20. In the case in which the transport vehicle 20 has the battery, the power supply devices may be installed in only some sections (power supply sections) without being installed on the entire rail 10. In a section (non-power supply section) in which no power supply device is installed, the transport vehicle 20 may travel using power stored in the battery.

Figure 5:
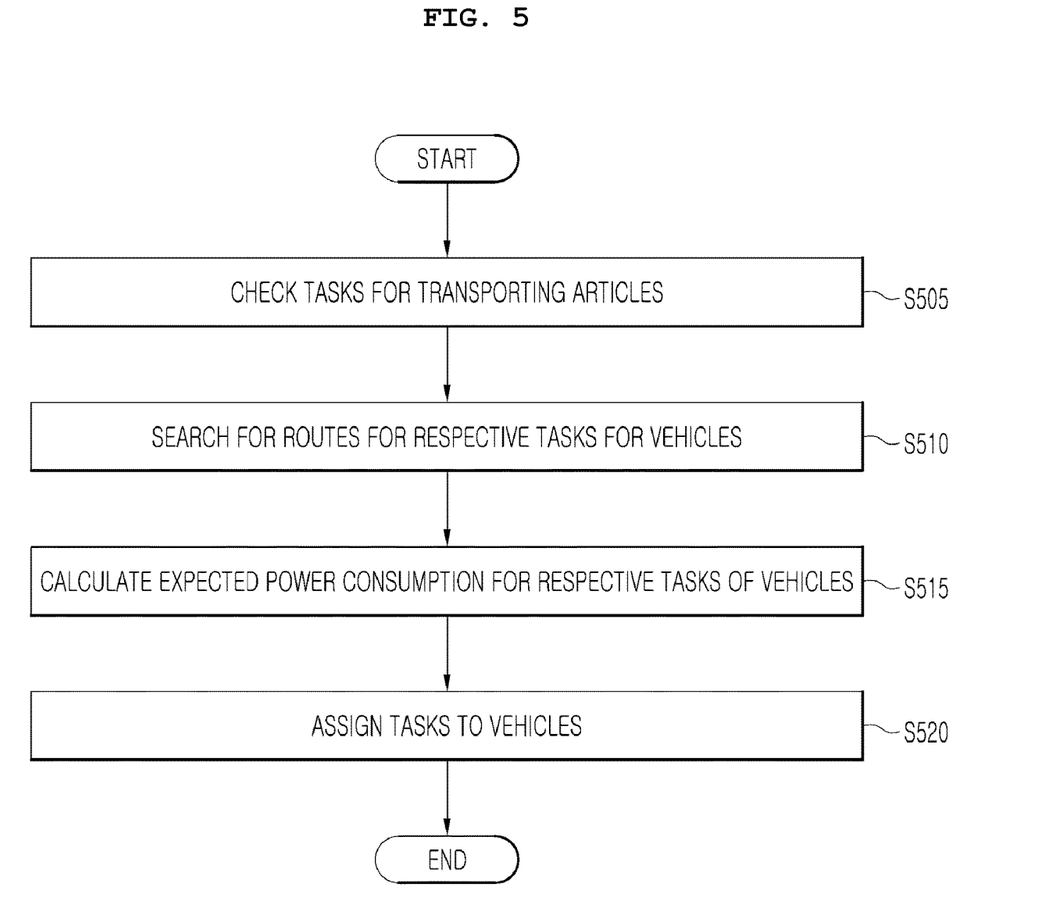
FIGS. 5 to 7 are flowcharts illustrating a method of controlling the transport vehicle according to the embodiment of the present disclosure.
Figure 6:
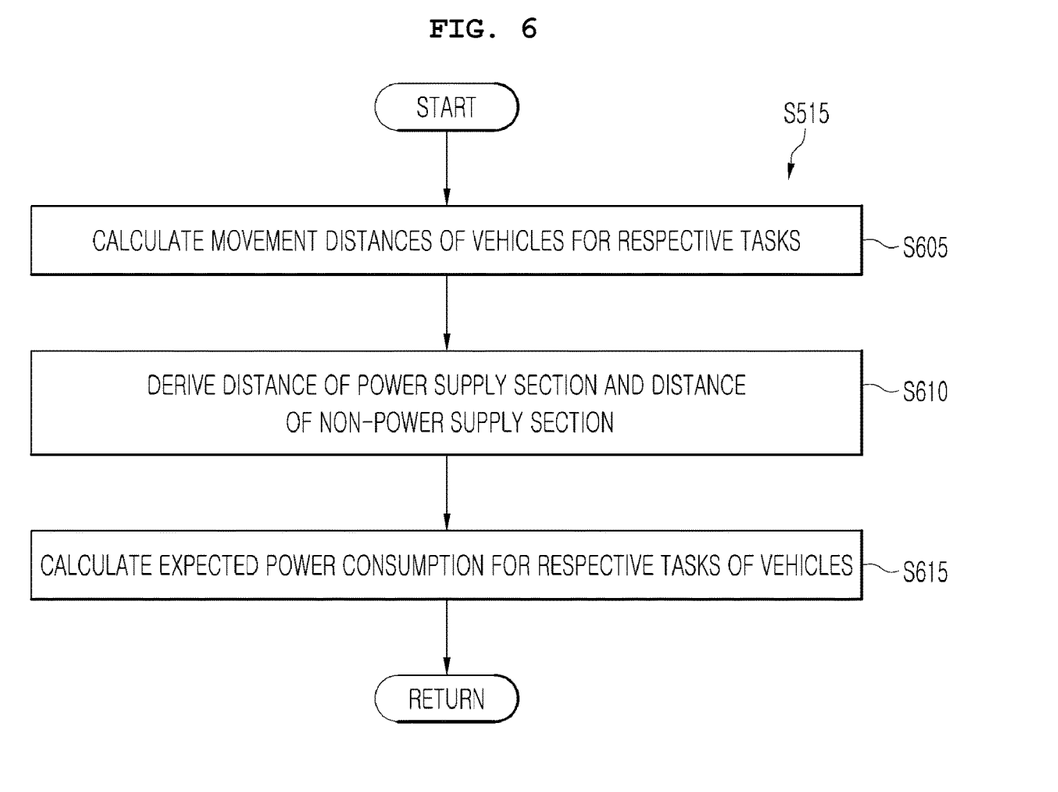
Figure 7:
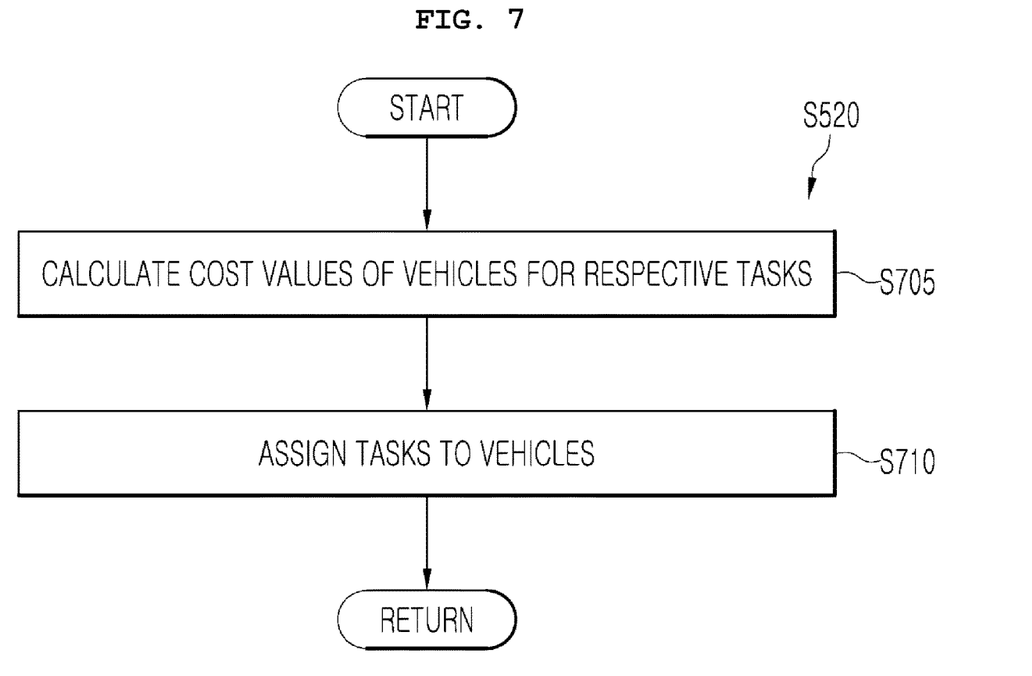

FIGS. 5 to 7 are flowcharts illustrating a method of controlling the transport vehicle according to the embodiment of the present disclosure. The processes illustrated in FIGS. 5 to 7 may be performed by the vehicle control device 150.

A method of controlling the transport vehicle 20 in the article transport system in the production factory according to the embodiment of the present disclosure includes a step S505 of checking tasks for transporting the articles, a step S510 of searching for routes for the respective tasks for the plurality of transport vehicles 20, a step S515 of calculating expected power consumption for the respective tasks of the respective transport vehicles 20, and a step S520 of assigning the tasks to the transport vehicles 20 based on the expected power consumption for the respective tasks and the remaining power of the transport vehicles 20.

Figure 8:
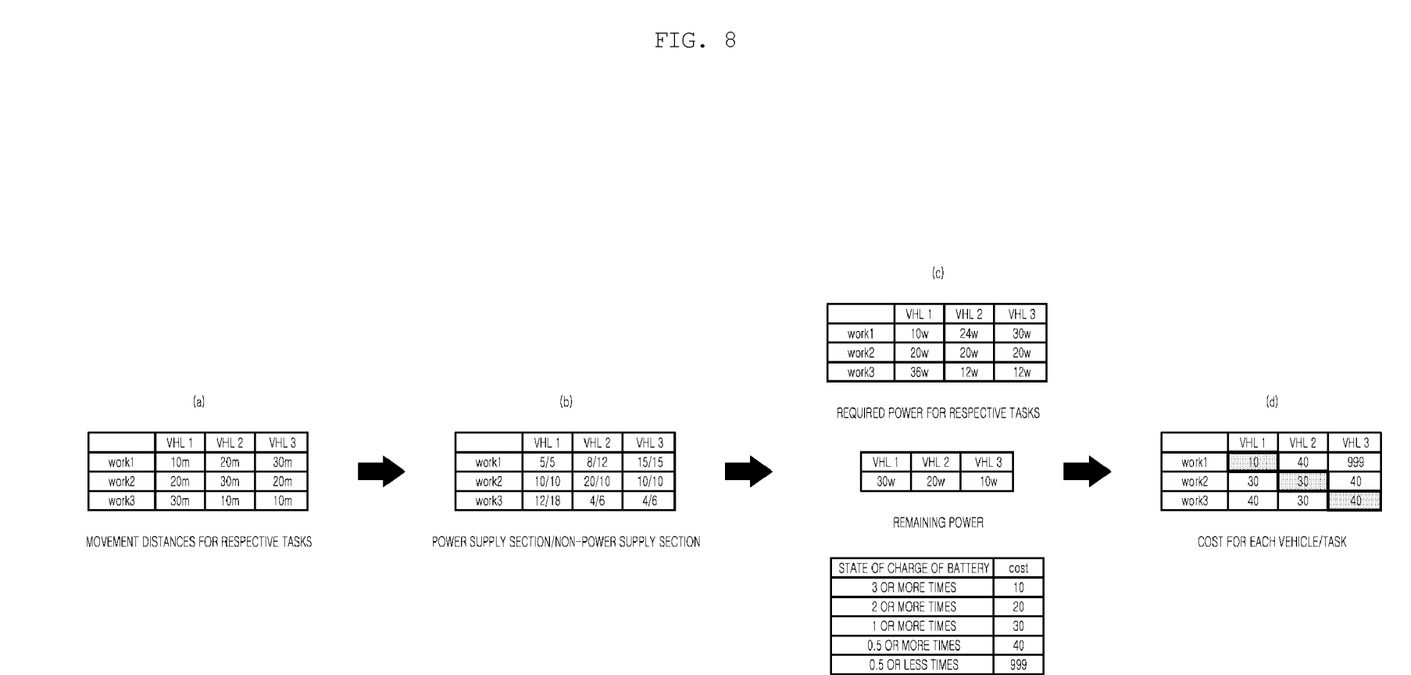
FIG. 8 is a view illustrating an example of a process of assigning a task to the transport vehicle according to the embodiment of the present disclosure.

Before the step S505, the manufacturing control device 100 creates the task information for the article transport in the production factory and transmits the task information to the vehicle control device 150. The vehicle control device 150 receives the task information from the manufacturing control device 100. In the step S505, the vehicle control device 150 checks the tasks for transporting the articles, which are received from the manufacturing control device 100. In the step S510, the vehicle control device 150 searches for the routes for the respective tasks for the plurality of transport vehicles 20. When the routes for the respective tasks are derived, the vehicle control device 150 may calculate movement distances by which the transport vehicles 20 travel along the routes for the respective tasks. For example, as illustrated in FIG. 8A, the movement distances of the vehicles for the respective tasks may be derived.

In the step S515, the vehicle control device 150 calculates expected power consumption for the respective tasks for the transport vehicles 20. Referring to FIG. 6, the step S515 of calculating the expected power consumption for the respective tasks includes a step S605 of calculating the movement distances of the transport vehicles 20 for the respective tasks, a step S610 of deriving a distance of the power supply section and a distance of the non-power supply section from the movement distances of the transport vehicles 20 for the respective tasks, and a step S615 of calculating the expected power consumption for the respective tasks of the transport vehicles 20 from the distance of the non-power supply section. For example, as illustrated in FIG. 8B, the distance of the power supply section and the distance of the non-power supply section may be derived from the movement distances of the vehicles for the respective tasks. For example, when a movement distance of a vehicle 2 (VHL 2) for a task 1 (work 1) is 20 m, a distance of the power supply section may be 8 m, and a distance of the non-power supply section may be 12 m.

In the step of S520, the vehicle control device 150 assigns the tasks to the transport vehicles 20 based on the expected power consumption for the respective tasks and the remaining power of the transport vehicles 20. Referring to FIG. 7, the step S520 of assigning the tasks to the transport vehicles 20 includes a step S705 of calculating cost values of the transport vehicles 20 for the respective tasks based on ratios between the expected power consumption for the respective tasks and the remaining power of the transport vehicles 20, and a step S710 of assigning the tasks to the transport vehicles 20 based on the cost values of the transport vehicles 20 for the respective tasks.

In the embodiment of the present disclosure, the cost values may be assigned in accordance with a range in which values made by dividing the remaining power of the transport vehicles 20 by the expected power consumption for the respective tasks are present. In addition, the cost value may be set to a maximum value when the value made by dividing the remaining power of each of the transport vehicles 20 by the expected power consumption for each task is smaller than a reference value.

For example, referring to FIG. 8C, the required power (expected power consumption) for the respective tasks of the transport vehicles 20 is acquired, the remaining power of the transport vehicles 20 is acquired, and the cost value is calculated in accordance with the range in which the value made by dividing the remaining power by the required power for each task is present. Referring to the cost table in FIG. 8C, the cost values are assigned for each range of the value made by dividing the remaining power of the transport vehicle 20 by the required power for each task. The cost value may be set to 10 when the remaining power is 3 or more times the required power, 20 when the remaining power is 2 or more times the required power, 30 when the remaining power is 1 or more times the required power, 40 when the remaining power is ½ or more times the required power, and a maximum value of 999 when the remaining power is ½ or less times the required power.

Referring to FIG. 8D, the remaining power of the vehicle 1 (VHL 1) is 30 W, the required power of the task 1 (work 1) is 10 W, the required power of the task 2 (work 2) is 20 W, and the required power of the task 3 (work 3) is 36 W. When the remaining power of the vehicle 1 (VHL 1) is divided by the required power of the respective tasks, the task 1 (work 1) is 30/10=3, the task 2 (work 2) is 30/20=1.5, and the task 3 (work 3) is 30/36=0.83. When the costs for the respective tasks are calculated by applying the values to the cost tables, the cost for the task 1 (work 1) is 10, the cost for the task 2 (work 2) is 30, and the cost for the task 3 (work 3) is 40. The same method of calculating the cost value may be applied to the vehicle 2 (VHL 2) and the vehicle 3 (VHL 3).

In the embodiment of the present disclosure, the step S710 of assigning the tasks to the transport vehicles 20 may include a step of assigning a specific task to a transport vehicle having the smallest cost value based on the specific task. In addition, the step S710 of assigning the tasks to the transport vehicles 20 may include a step of assigning a task, which has the smallest cost value based on a specific transport vehicle, to the specific transport vehicle.

For example, as illustrated in FIG. 8D, the task may be assigned to the vehicle 1 (VHL 1) which is the transport vehicle having the smallest cost value based on the task 1 (work 1), the task may be assigned to the vehicle 2 (VHL 2) which is the transport vehicle having the smallest cost value except for the vehicle 1 (VHL 1) based on the task 2 (work 2), and then the task may be assigned to the vehicle 3 (VHL 3) based on the task 3 (work 3).

On the contrary, the task 1 (work 1) having the smallest cost value based on the vehicle 1 (VHL 1) may be assigned to the vehicle 1 (VHL 1), the task 2 (work 2) having the smallest cost value except for the task 1 (work 1) based on the vehicle 2 (VHL 2) may be assigned to the vehicle 2 (VHL 2), and the task 3 may be assigned to the vehicle 3 (VHL 3).

The method of controlling the transport vehicle 20 having the battery, which has been described with respect to FIGS. 5 to 7, may be performed by the processor 152 of the vehicle control device 150. The processor 152 may be configured to check the tasks for transporting the articles, search for the routes for the respective tasks for the plurality of transport vehicles 20, calculate the expected power consumption for the respective tasks of the transport vehicles 20, and assign the tasks to the transport vehicles 20 based on the expected power consumption for the respective tasks and the remaining power of the transport vehicles 20.

In the embodiment, the processor 152 may be configured to calculate the movement distances of the transport vehicles 20 for the respective tasks, derive the distance of the power supply section and the distance of the non-power supply section from the movement distances of the transport vehicles 20 for the respective tasks, and calculate the expected power consumption for the respective tasks of the transport vehicles 20 from the distance of the non-power supply section.

In the embodiment, the processor 152 may be configured to calculate the cost values of the transport vehicles 20 for the respective tasks based on the ratios between the expected power consumption for the respective tasks and the remaining power of the transport vehicles 20, and assign the tasks to the transport vehicles 20 based on the cost values of the transport vehicles 20 for the respective tasks.

In the embodiment, the cost values may be assigned in accordance with the range in which the values made by dividing the remaining power of the transport vehicles 20 by the expected power consumption for the respective tasks are present.

In the embodiment, the cost value may be set to a maximum value when the value made by dividing the remaining power of each of the transport vehicles 20 by the expected power consumption for each task is smaller than the reference value.

In the embodiment, the processor 152 may be configured to assign a specific task to a transport vehicle having the smallest cost value based on the specific task.

In the embodiment, the processor 152 may be configured to assign a task, which has the smallest cost value based on a specific transport vehicle, to the specific transport vehicle.

Figure 9:
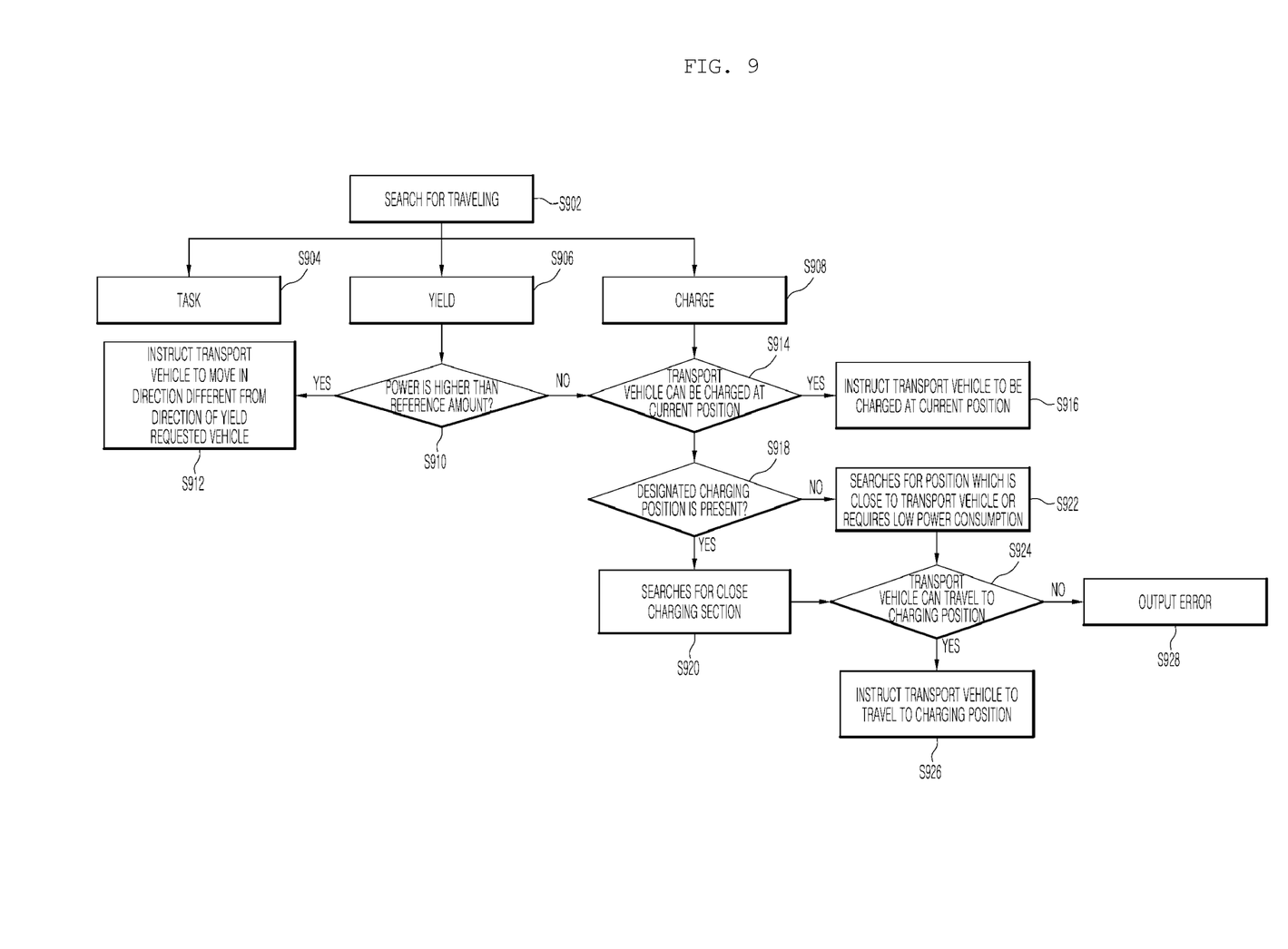
FIG. 9 is a flowchart illustrating an example of a method of controlling the movement of the transport vehicle having a battery according to the embodiment of the present disclosure.

FIG. 9 is a flowchart illustrating an example of the method of controlling the movement of the transport vehicle 20 having a battery according to the embodiment of the present disclosure. The operations illustrated in FIG. 9 may be performed by the vehicle control device 150.

Referring to FIG. 9, the vehicle control device 150 searches for a traveling operation to be performed by the specific transport vehicle 20 (S902) and instructs the transport vehicle 20 to travel and perform the corresponding task when the specific task is assigned to the transport vehicle 20 (S904). Meanwhile, when another vehicle blocks the movement route and thus the transport vehicle 20 needs to travel by yielding to the vehicle (S906), the vehicle control device 150 determines whether the remaining power stored in the battery of the transport vehicle 20 is higher than a reference amount (S910). When the remaining power is higher than the reference amount, the vehicle control device 150 instructs the transport vehicle 20 to move in a direction different from the direction of the yield-requested vehicle (S912).

When the remaining power is lower than the reference amount or the battery needs to be charged, the vehicle control device 150 checks whether the transport vehicle 20 can be charged at the current position (S914). When the transport vehicle 20 can be charged at the current position, the vehicle control device 150 instructs the transport vehicle 20 to charge the battery at the current position (S916).

When the transport vehicle 20 cannot be charged at the current position, the vehicle control device 150 determines whether a charging position designated for the transport vehicle 20 is present (S918). When the designated charging position is present, the vehicle control device 150 searches for a close charging section at the designated charging position (S920). When the designated charging position is not present, the vehicle control device 150 searches for a charging position which is close to the transport vehicle or requires low power consumption (S922). When the charging position is determined, the vehicle control device 150 determines whether the transport vehicle can travel to the charging position (S924). When the transport vehicle can travel to the charging position, the vehicle control device 150 instructs the transport vehicle to travel to the charging position (S926). When the transport vehicle cannot travel to the charging position, the vehicle control device 150 outputs an error signal indicating that the transport vehicle cannot travel to the charging position (S928).

The present embodiments and the drawings attached to the present specification clearly show only a part of the technical spirit included in the present disclosure. It will be apparent that all the modified examples and the specific embodiments, which may be easily inferred by those skilled in the art within the scope of the technical spirit included in the specification and the drawings of the present disclosure, are included in the scope of the present disclosure.

Accordingly, the spirit of the present disclosure should not be limited to the described embodiment, and all of the equivalents or equivalent modifications of the claims as well as the appended claims belong to the scope of the spirit of the present disclosure.

What is claimed is:

1. A method of controlling a transport vehicle in an article transport system in a production factory, the method comprising:
   checking tasks for transporting articles;
   searching for routes for the respective tasks for a plurality of transport vehicles;
   calculating expected power consumption for the respective tasks of the transport vehicles; and
   assigning the tasks to the transport vehicles based on the expected power consumption for the respective tasks and remaining power of the transport vehicles,
   wherein the assigning of the tasks to the transport vehicles comprises:
   calculating cost values of the transport vehicles for the respective tasks based on ratios between the expected power consumption for the respective tasks and the remaining power of the transport vehicles; and
   assigning the tasks to the transport vehicles based on the cost values of the transport vehicles for the respective tasks, and
   wherein the cost values are assigned in accordance with a range in which values made by dividing the remaining power of the transport vehicles by the expected power consumption for the respective tasks are present.

2. The method of claim 1,
   wherein the calculating of the expected power consumption for the respective tasks comprises:
   calculating movement distances of the transport vehicles for the respective tasks;
   deriving a distance of a power supply section and a distance of a non-power supply section from the movement distances of the transport vehicles for the respective tasks; and
   calculating expected power consumption for the respective tasks of the transport vehicles from the distance of the non-power supply section.

3. The method of claim 1, wherein the cost value is set to a maximum value when the value made by dividing the remaining power of each of the transport vehicles by the expected power consumption for each task is smaller than a reference value.

4. The method of claim 1, wherein the assigning of the tasks to the transport vehicles comprises assigning a specific task to a transport vehicle having the smallest cost value based on the specific task.

5. The method of claim 1, wherein the assigning of the tasks to the transport vehicles comprises assigning a task, which has the smallest cost value based on a specific transport vehicle, to the specific transport vehicle.

* * * * *